(12) United States Patent
Qing et al.

(10) Patent No.: US 10,964,797 B2
(45) Date of Patent: Mar. 30, 2021

(54) SEMICONDUCTOR STRUCTURE AND METHOD FOR FORMING SAME

(71) Applicants: Semiconductor Manufacturing International (Beijing) Corporation, Beijing (CN); Semiconductor Manufacturing International (Shanghai) Corporation, Shanghai (CN)

(72) Inventors: Zhang Qing, Shanghai (CN); Jin Yi, Shanghai (CN); Jiang Li, Shanghai (CN); Ji Deng Feng, Shanghai (CN); Liu Lu, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/601,844

(22) Filed: Oct. 15, 2019

(65) Prior Publication Data
US 2020/0211859 A1 Jul. 2, 2020

(30) Foreign Application Priority Data
Dec. 26, 2018 (CN) .......................... 201811605467.3

(51) Int. Cl.
*H01L 29/66* (2006.01)
*H01L 21/321* (2006.01)
(Continued)

(52) U.S. Cl.
CPC .. *H01L 29/66545* (2013.01); *H01L 21/28079* (2013.01); *H01L 21/302* (2013.01);
(Continued)

(58) Field of Classification Search
CPC ............ H01L 21/02024; H01L 21/302; H01L 21/304; H01L 21/30625; H01L 21/3212;
(Continued)

(56) References Cited

U.S. PATENT DOCUMENTS 6,943,113 B1* 9/2005 Lin ..................... H01L 21/3212
257/E21.304
2008/0283929 A1* 11/2008 Nabatame ......... H01L 21/82385
257/369
(Continued)

*Primary Examiner* — Eduardo A Rodela
(74) *Attorney, Agent, or Firm* — Brinks Gilson & Lione

(57) ABSTRACT

A semiconductor structure and a method for forming same, the forming method including: providing a base, where a dummy gate structure is formed on the base, an interlayer dielectric layer is formed on the base the dummy gate structure exposes, and the interlayer dielectric layer exposes the top of the dummy gate structure; forming an isolation structure in the interlayer dielectric layer between adjacent dummy gate structures, where the isolation structure further extends into the base; after forming the isolation structure, removing the dummy gate structure and forming a gate opening in the interlayer dielectric layer; filling a gate electrode material into the gate opening, where the gate electrode material further covers the top of the interlayer dielectric layer; and performing at least one polishing treatment to remove the gate electrode material above the top of the interlayer dielectric layer and retaining the gate electrode material in the gate opening as a gate electrode layer, where the step of the polishing treatment includes: performing first polishing treatment using a metal polishing liquid; and performing second polishing treatment using deionized water. With the second polishing performance, the probability of forming a residue of the gate electrode material on the top surface of the interlayer dielectric layer is reduced, thereby improving device performance.

15 Claims, 7 Drawing Sheets

(51) Int. Cl.
*H01L 21/762* (2006.01)
*H01L 21/28* (2006.01)
*H01L 21/3105* (2006.01)
*H01L 21/302* (2006.01)
*H01L 21/8234* (2006.01)
*H01L 21/304* (2006.01)
*H01L 21/8238* (2006.01)

(52) U.S. Cl.
CPC ...... *H01L 21/304* (2013.01); *H01L 21/31053* (2013.01); *H01L 21/3212* (2013.01); *H01L 21/76224* (2013.01); *H01L 21/823437* (2013.01); *H01L 21/823828* (2013.01)

(58) Field of Classification Search
CPC .................. H01L 21/461; H01L 21/463; H01L 21/28176; H01L 21/823437; H01L 21/823828; H01L 21/82385; H01L 29/30; H01L 29/1033; H01L 29/1079; H01L 29/4232; H01L 29/49; H01L 29/66477; H01L 29/66545; H01L 29/66606; H01L 29/66871; H01L 2224/03602; H01L 2224/03616; H01L 2224/11602; H01L 2224/11616; H01L 2224/27602; H01L 2224/27616; H01L 2224/27845
See application file for complete search history.

(56) References Cited

U.S. PATENT DOCUMENTS

| | | | |
|---|---|---|---|
| 2016/0111336 A1* | 4/2016 | Chang | H01L 21/82343 257/401 |
| 2018/0151395 A1* | 5/2018 | Park | C11D 11/0047 |
| 2018/0286699 A1* | 10/2018 | Lin | H01L 21/3212 |

* cited by examiner

SEMICONDUCTOR STRUCTURE AND METHOD FOR FORMING SAME

RELATED APPLICATIONS

The present application claims priority to Chinese Patent Appln. No. 201811605467.3, filed Dec. 26, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

A main semiconductor device for an integrated circuit, in particular for a very-large-scale integrated circuit, is a metal-oxide-semiconductor field effect transistor (MOS transistor). With the development trend of the very-large-scale integrated circuit, the integrated circuit has become more and more complex, and a technical node for the semiconductor device is continually reduced. When the size of the semiconductor device is reduced to a certain degree, various second-order effects caused by a physical limit of the semiconductor device appear successively, for example, the problem of high leakage current of the semiconductor device. In order to ameliorate the problem of leakage current, a conventional silicon dioxide gate dielectric material is mainly replaced by a high k gate dielectric material currently, and metal is used as a gate electrode, so as to avoid a Fermi level pinning effect and a boron penetration effect between a high k material and a conventional gate electrode material.

Moreover, as the size of the semiconductor device becomes continually smaller, the distance between adjacent transistors becomes correspondingly smaller as well, and a phenomenon of merging may occur to a source-drain doping layer of the adjacent transistors easily, thereby resulting in source-drain bridging of the adjacent transistors. In order to prevent the source-drain bridging of the adjacent transistors, a technique for manufacturing a single diffusion break (SDB) isolation structure is introduced into the prior art.

SUMMARY

A problem addressed by the embodiments and implementations of the present disclosure is to provide a semiconductor structure and a method for forming same, so as to improve device performance.

To address the foregoing problem, one form of the present disclosure provides a method for forming a semiconductor structure. The method may include: providing a base, where a dummy gate structure is formed on the base, an interlayer dielectric layer is formed on the base exposed by the dummy gate structure, and the interlayer dielectric layer covers side walls of the dummy gate structure and exposes a top of the dummy gate structure; forming an isolation structure in the interlayer dielectric layer between adjacent dummy gate structures, where the isolation structure further extends into the base; after forming the isolation structure, removing the dummy gate structure and forming a gate opening in the interlayer dielectric layer; filling a gate electrode material into the gate opening, where the gate electrode material further covers the top of the interlayer dielectric layer; and performing at least one polishing treatment to remove the gate electrode material above the top of the interlayer dielectric layer and retaining the gate electrode material in the gate opening as a gate electrode layer, where the step of the polishing treatment includes: performing first polishing treatment on the gate electrode material using a metal polishing liquid; and after the first polishing treatment, performing second polishing treatment on the isolation structure using deionized water.

In some implementations, the method further includes: after filling a gate electrode material into the gate opening and before performing the polishing treatment, performing pre-treatment on the gate electrode material to remove partial thickness of the gate electrode material and expose the top of the isolation structure.

In some implementations, the pre-treatment is performed in one or both of a chemical mechanical polishing manner and an etch-back manner.

In some implementations, the number of times of the polishing treatment is 3 to 12.

In some implementations, the process time of the second polishing treatment is 5 seconds to 15 seconds in each polishing treatment.

In some implementations, the process time of the second polishing treatment is 10 seconds to 15 seconds in each polishing treatment.

In some implementations, the PH value of the metal polishing liquid is 2 to 6 in the step of the first polishing treatment.

In some implementations, parameters of the second polishing treatment include: a down force is 1.0 psi to 3.0 psi, a platen speed is 30 rpm to 100 rpm, and a flow rate of the deionized water is 100 ml/min to 300 ml/min.

In some implementations, a material of the isolation structure is silicon nitride, polysilicon or metal nitride.

In some implementations, the hardness of the isolation structure is higher than the hardness of the interlayer dielectric layer.

In some implementations, a material of the interlayer dielectric layer is silicon oxide, and the material of the isolation structure is silicon nitride.

In some implementations, the step of forming the isolation structure includes: etching the interlayer dielectric layer between the adjacent dummy gate structures and partial thickness of the base sequentially to form a trench located in the interlayer dielectric layer and the base; filling an isolation material into the trench, where the isolation material further covers the top of the interlayer dielectric layer; and using a planarization process to remove the isolation material above the top of the interlayer dielectric layer and retaining the isolation material in the trench as the isolation structure.

In some implementations, the planarization process is one or both of the chemical mechanical polishing manner and the etch-back manner.

In some implementations, in the step of filling a gate electrode material into the gate opening, the gate electrode material is W, Al, Cu, Ag, Au, Pt, Ni or Ti.

Another form of the present disclosure provides a semiconductor structure formed by forming methods according to the present disclosure.

Compared with the prior art, technical solutions of the embodiments and implementations of the present disclosure have the following advantages:

In the embodiments and implementations of the present disclosure, after the gate electrode material is filled into the gate opening, at least one polishing treatment is performed to remove the gate electrode material above the top of the interlayer dielectric layer and the gate electrode material in the gate opening is retained as a gate electrode layer. The polishing treatment includes sequentially performing a first polishing treatment and a second polishing treatment. Moreover, a metal polishing liquid is used for the first polishing treatment, and deionized water is used for the second polishing treatment. The first polishing treatment is used for removing the gate electrode material, so that the metal polishing liquid is generally an acid polishing liquid. Since an acid solution residue is present on the surface of a wafer after each first polishing treatment, in the process of the second polishing process performed successively, the isolation structure is in an acid environment, and a hydration reaction occurs to the isolation structure, so that the hardness and the strength, which are impacted by the second polishing treatment, of the isolation structure are reduced, and it is easy to thin the isolation structure through the second polishing treatment. To this end, even though the top of the isolation structure protrudes from the top of the interlayer dielectric layer after the isolation structure is formed in the interlayer dielectric layer and the base, in the step of removing the gate electrode material above the top of the interlayer dielectric layer, the isolation structure protruding from the interlayer dielectric layer may also be removed, so that the gate electrode material located on the top surface of the interlayer dielectric layer may be exposed in the process environment of the first polishing treatment, so as to reduce the degree of difficulty in removing the gate electrode material on the top surface of the interlayer dielectric layer, correspondingly, thereby significantly reducing the probability of forming a residue of the gate electrode material on the top surface of the interlayer dielectric layer, and thus improving device performance.

BRIEF DESCRIPTION OF THE DRAWINGS

The accompanying drawings constitute a part of this specification, describe exemplary embodiments and implementations of the present disclosure, and are used to explain the principles of the present disclosure together with this specification. In the accompanying drawings.

DETAILED DESCRIPTION

Currently, introducing an SDB isolation structure into a semiconductor structure may cause a device performance to be reduced easily. The reason why the performance is reduced is analyzed below in combination with a method for forming a semiconductor structure.

Referring to FIG. 1 to FIG. 6, schematic structural diagrams corresponding to steps of a method for forming a semiconductor structure are shown.

Figure 1:
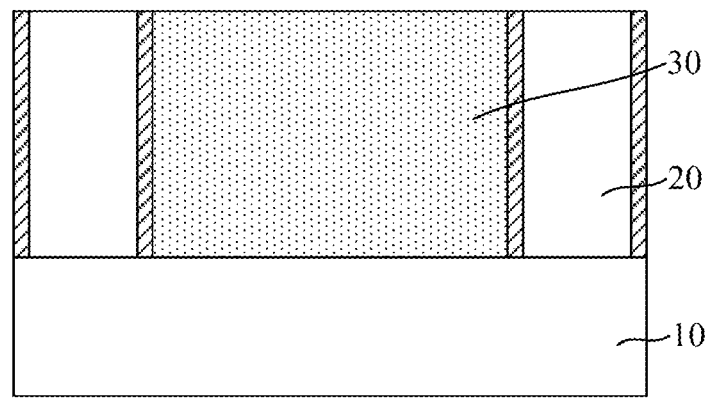
FIG. 1 to FIG. 6 are schematic structural diagrams corresponding to steps of a method for forming a semiconductor structure.

Referring to FIG. 1, a base 10 is provided. A dummy gate structure 20 is formed on the base 10, an interlayer dielectric layer 30 is formed on the base 10 exposed by the dummy gate structure 20, and the interlayer dielectric layer 30 covers side walls of the dummy gate structure 20 and exposes the top of the dummy gate structure 20.

Figure 2:
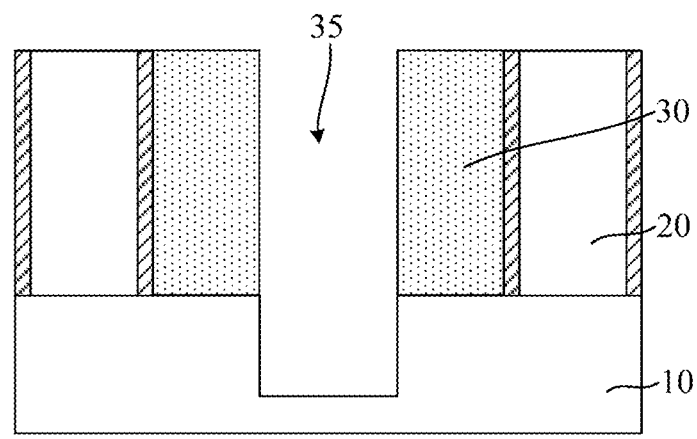

Referring to FIG. 2, the interlayer dielectric layer 30 between adjacent dummy gate structures 20 and partial thickness of the base 10 are etched sequentially to form a trench 35.

Figure 3:
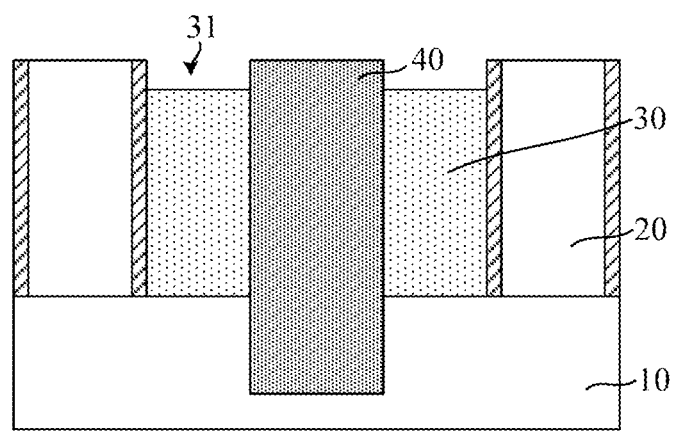

Referring to FIG. 3, an SDB isolation structure 40 is formed in the trench 35 (as shown in FIG. 2).

In order to improve an isolation effect of the SDB isolation structure 40, a material selected by the SDB isolation structure 40 is generally silicon nitride.

Figure 4:
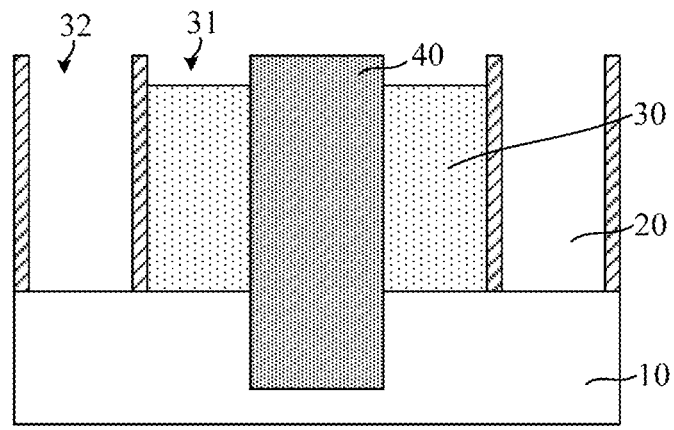

Referring to FIG. 4, after the SDB isolation structure 40 is formed, the dummy gate structure 20 (as shown in FIG. 3) is removed and a gate opening 32 is formed in the interlayer dielectric layer 30.

Figure 5:
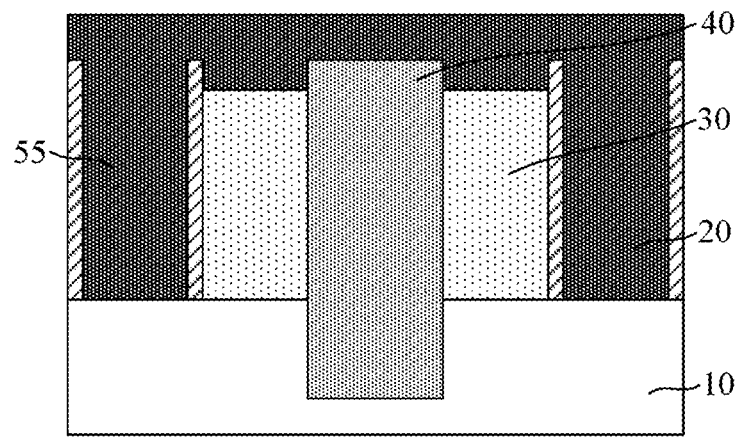

Referring to FIG. 5, a gate electrode material 55 is filled into the gate opening 32 (as shown in FIG. 4). The gate electrode material 55 further covers the top of the interlayer dielectric layer 30.

Figure 6:
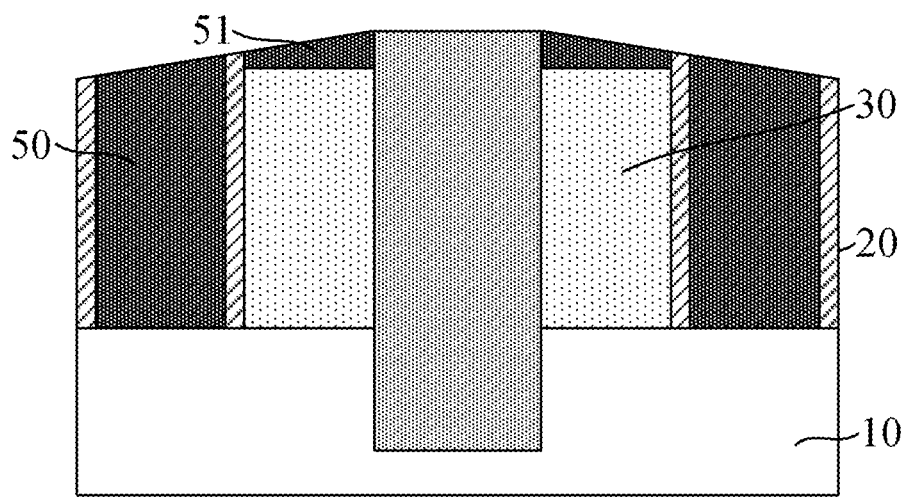

Referring to FIG. 6, planarization treatment is performed on the gate electrode material 55 (as shown in FIG. 5) using a chemical mechanical polishing process, and the gate electrode material 55 in the gate opening 32 (as shown in FIG. 4) is retained as a gate electrode layer 50.

The process of forming the SDB isolation structure 40 in the trench 35 generally includes a step of filling an isolation material and a step of performing planarization (for example, chemical mechanical polishing) treatment on the isolation material. Since a material of the interlayer dielectric layer 30 is generally silicon oxide, and the interlayer dielectric layer 30 is relatively fluffy, in the planarization process of forming the SDB isolation structure 40, the problem of dishing may occur to the top surface of the interlayer dielectric layer 30 easily, thus causing the top of the SDB isolation structure 40 to protrude from the top of the interlayer dielectric layer 30, and the lower the pattern density of the SDB isolation structure 40 is, the severer the dishing problem of the interlayer dielectric layer 30 is.

Generally, the gate electrode material 55 is a metal material (for example, W). To this end, the planarization treatment is performed on the gate electrode material 55 (as shown in FIG. 4) using the chemical mechanical polishing process, and a polishing liquid used for removing the gate electrode material 55 is generally an acid polishing liquid.

However, the removal rate (RR) for the SDB isolation structure 40 by the polishing liquid is relatively low, which causes the SDB isolation structure 40 protruding from the interlayer dielectric layer 30 to block the polishing of the gate electrode material 55, and after the polishing of the gate electrode material 55 is completed, a metal residue 51 is formed on the top of the interlayer dielectric layer 30 easily, thus having adverse impact on device performance.

To address the technical problem, in some embodiments and implementations of the present disclosure, after the gate electrode material is filled into the gate opening, at least one polishing treatment is performed to remove the gate electrode material above the top of the interlayer dielectric layer and the gate electrode material in the gate opening is retained as a gate electrode layer. The polishing treatment includes sequentially performing a first polishing treatment and a second polishing treatment. Moreover, a metal polishing liquid is used for the first polishing treatment, and deionized water is used for the second polishing treatment. The first polishing treatment is used for removing the gate electrode material, so that the metal polishing liquid is generally an acid polishing liquid. Since there an acid solution residue is present on the surface of a wafer after each first polishing treatment, in the process of the second polishing process performed successively, the isolation structure is in an acid environment, and a hydration reaction occurs to the isolation structure, so that the hardness and the strength, which are impacted by the second polishing treatment, of the isolation structure are reduced, and it is easy to thin the isolation structure through the second polishing treatment. To this end, even though the top of the isolation structure protrudes from the interlayer dielectric layer, in the step of removing the gate electrode material above the top of the interlayer dielectric layer, the isolation structure protruding from the interlayer dielectric layer may also be removed, so that the gate electrode material located on the top surface of the interlayer dielectric layer may be exposed in the process environment of the first polishing treatment, so as to reduce the degree of difficulty in removing the gate electrode material on the top surface of the interlayer dielectric layer, correspondingly, thereby significantly reducing the probability of forming a residue of the gate electrode material on the top surface of the interlayer dielectric layer, and thus improving device performance.

To address the foregoing objectives, features and advantages of the embodiments of the present disclosure easier to understand, specific embodiments and implementations of the present disclosure are described in detail below with reference to the accompanying drawings.

FIG. 7 to FIG. 14 are schematic structural diagrams corresponding to steps in one form of a method for forming a semiconductor structure according to the present disclosure.

Figure 7:
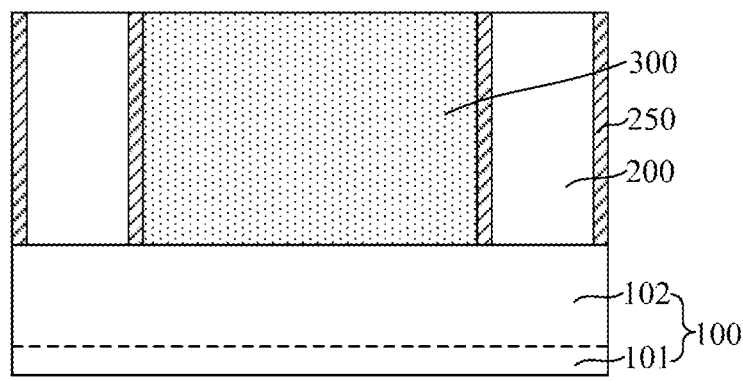
FIG. 7 to FIG. 14 are schematic structural diagrams corresponding to steps in one form of a method for forming a semiconductor structure according to the present disclosure.

Referring to FIG. 7, a base 100 is provided. A dummy gate structure 200 is formed on the base 100, an interlayer dielectric layer 300 is formed on the base 100 exposed by the dummy gate structure 200, and the interlayer dielectric layer 300 covers side walls of the dummy gate structure 200 and exposes the top of the dummy gate structure 200.

The base 100 is used for providing a process platform for a subsequent process.

In some implementations, a formed device serving as a fin field effect transistor is used as an example, and the base 100 includes a substrate 101 and a fin 102 protruding from the substrate 101.

Specifically, a material of the substrate 101 is silicon. In other implementations, the material of the substrate 101 may also be germanium, silicon germanide, silicon carbide, gallium arsenide, indium gallide or the like. The substrate may also be other types of substrates such as a silicon substrate on an insulator or a germanium substrate on an insulator.

In some implementations, the fin 102 and the substrate 101 are of an integrated structure. In other implementations, the fin may also be a semiconductor layer epitaxially grown on the substrate, thereby achieving an objective of controlling the height of the fin precisely.

Therefore, in some implementations, a material of the fin 102 is the same as the material of the substrate 101, and the material of the fin 102 is silicon. In other implementations, the material of the fin may also be a semiconductor material suitable for forming the fin, such as germanium, silicon germanide, silicon carbide, gallium arsenide or indium gallide. The material of the fin may also be different from the material of the substrate.

The dummy gate structure 200 is used for occupying a spatial position for forming a metal gate structure subsequently.

In some implementations, the dummy gate structure 200 crosses the fin 102 and covers a part of the top of and a part of side walls of the fin 102.

In some implementations, the dummy gate structure 200 being of a single-layer structure is used as an example, and a material of the dummy gate structure 200 is polysilicon.

In some other implementations, when the dummy gate structure is of a single-layer structure, the material of the dummy gate structure may also be silicon oxide, silicon nitride, silicon oxynitride, silicon carbide, silicon carbonitride silicon oxy-carbonitride or amorphous carbon or the like.

In other implementations, the dummy gate structure may also be of a laminate structure and includes a dummy gate oxide layer and a dummy gate layer located on the dummy gate oxide layer, where a material of the dummy gate layer may be polisilicon or amorphous carbon, and a material of the dummy oxide layer may be silicon oxide or silicon oxynitride.

In some implementations, spacers 250 are formed on the side walls of the dummy gate structure 200.

The spacers 250 are used for defining regions for forming a source-drain doping layer subsequently, and further used for protecting the side walls of the dummy gate structure 200 in a subsequent process.

A material of the spacer 250 may be one or more of silicon oxide, silicon nitride, silicon carbide, silicon carbonitride, silicon oxy-carbonitride, silicon oxynitride, boron nitride and boron carbonitride, and the spacer 250 may be of a single-layer structure or a laminate structure. In some implementations, the spacer 250 is of a single-layer structure, and the material of the spacer 250 is silicon nitride.

In some implementations, after the spacer 250 is formed, the interlayer dielectric layer 300 is formed on the base 100 exposed by the dummy gate structure 200 and the spacer 250.

The interlayer dielectric layer 300 is used for implementing electric isolation between adjacent devices, and further used for defining the size and position of a metal gate structure formed subsequently.

A material of the interlayer dielectric layer 300 is an insulating material. In some implementations, the material of the interlayer dielectric layer 300 is silicon oxide. In other implementations, the material of the interlayer dielectric layer may also be another dielectric material such as silicon nitride or silicon oxynitride.

In some implementations, the top of the interlayer dielectric layer 300 is flush with the top of the spacer 250.

Figure 8:
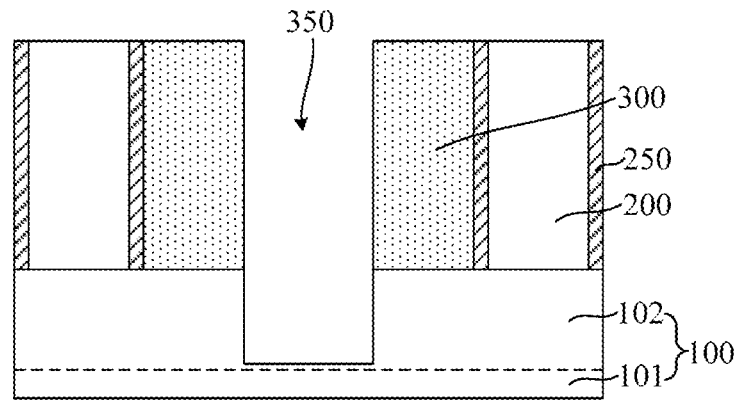
Figure 9:
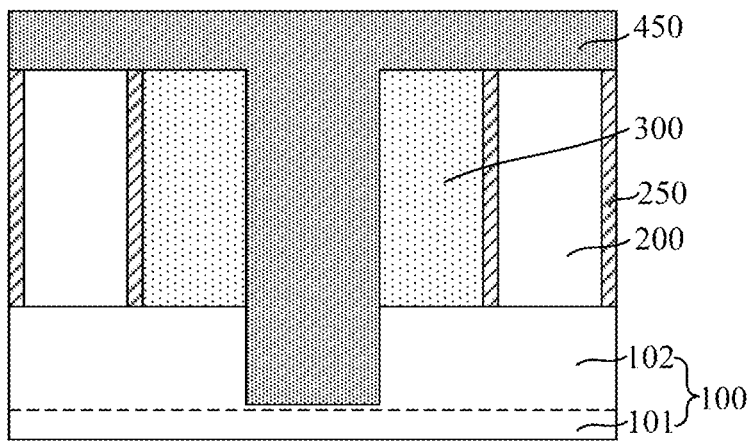
Figure 10:
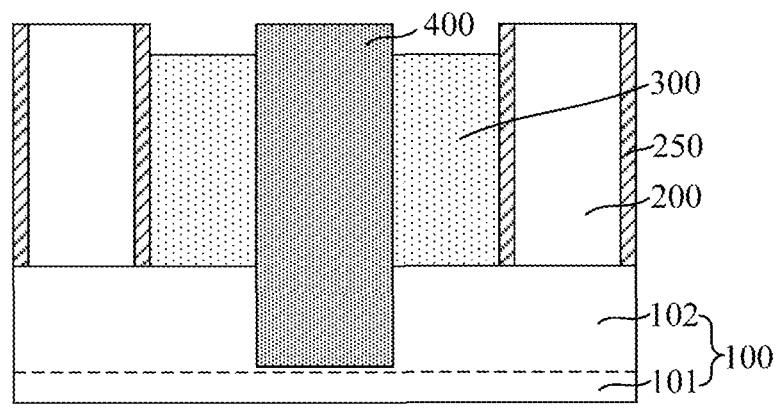

Referring to FIG. 8 to FIG. 10 in combination, an isolation structure 400 (as shown in FIG. 10) is formed in the interlayer dielectric layer 300 between adjacent dummy gate structures 200, and the isolation structure 400 further extends into the base 100.

The isolation structure 400 is used as an SDB isolation structure for isolating adjacent devices.

As the size of the devices reduces, along an extending direction of the fin 110, the head to head distance (HTH) between ends of adjacent fins 110 becomes smaller continuously, and the distance between adjacent metal gate structures are smaller and smaller as well. The isolation structure 400 is distributed in the extending direction of the fin 102, and isolation may be implemented between adjacent devices through the isolation structure 400, so as to reduce the probability of bridging between source regions and drain regions of the adjacent devices, so that the performance and yield of the devices may be improved.

To this end, in some implementations, along a direction perpendicular to the side walls of the dummy gate structure 200, the isolation structure 400 is formed between adjacent dummy gate structures 200.

In some implementations, a material of the isolation structure 400 is silicon nitride. Silicon nitride is a common isolation material and has better isolation effect and process compatibility. In some other implementations, the material of the isolation structure may also be polysilicon or metal nitride (for example, titanium nitride or tantalum nitride or the like).

To this end, the hardness of the isolation structure 400 is higher than the hardness of the interlayer dielectric layer 300.

Specifically, the step of forming the isolation structure 400 includes:

Referring to FIG. 8, the interlayer dielectric layer 300 between adjacent dummy gate structures 200 and partial thickness of the base 100 are etched sequentially to form a trench 350 located in the interlayer dielectric layer 300 and the base 100.

The trench 350 is used for providing a spatial position for forming an isolation structure subsequently.

In some implementations, the interlayer dielectric layer 300 and partial thickness of the fin 102 are etched sequentially, so that the interlayer dielectric layer 300 and the fin 102 form the trench 350, that is, the bottom of the trench 350 is located in the fin 102. In other implementations, the interlayer dielectric layer, the fin, and partial thickness of the substrate may also be etched sequentially, so that the interlayer dielectric layer, the fin, and the substrate form the trench, and the bottom of the trench is located in the substrate correspondingly.

Referring to FIG. 9, an isolation material 450 is filled into the trench 350 (as shown in FIG. 8). The gate electrode material 450 further covers the top of the interlayer dielectric layer 300.

In some implementations, the isolation material 450 is silicon nitride, and the isolation material 450 is filled into the trench 350 in a chemical vapor deposition manner.

Referring to FIG. 10, the isolation material 450 (as shown in FIG. 9) above the top of the interlayer dielectric layer 300 is removed using a planarization process, and the isolation material 450 in the trench 350 (as shown in FIG. 8) is retained as the isolation structure 400.

In some implementations, the planarization process is a chemical mechanical polishing process.

In other implementations, other planarization processes may also be used. For example, etch-back treatment is performed on the isolation material to remove the isolation material above the top of the interlayer dielectric layer, or a process combining chemical mechanical polishing treatment with etch-back treatment is used for removing the isolation material above the top of the interlayer dielectric layer.

It should be noted that since the hardness of the interlayer dielectric layer 300 is less than the hardness of the isolation structure 400, after the isolation material 450 above the top of the interlayer dielectric layer 300 is removed, dishing may occur to the top surface of the interlayer dielectric layer 300 around the isolation structure 400 easily, that is, the event that the top of the isolation structure 400 protrudes from the top of the interlayer dielectric layer 300 may appear easily, which, correspondingly, may cause the spacer 250 to protrude from the interlayer dielectric layer 300.

Figure 11:
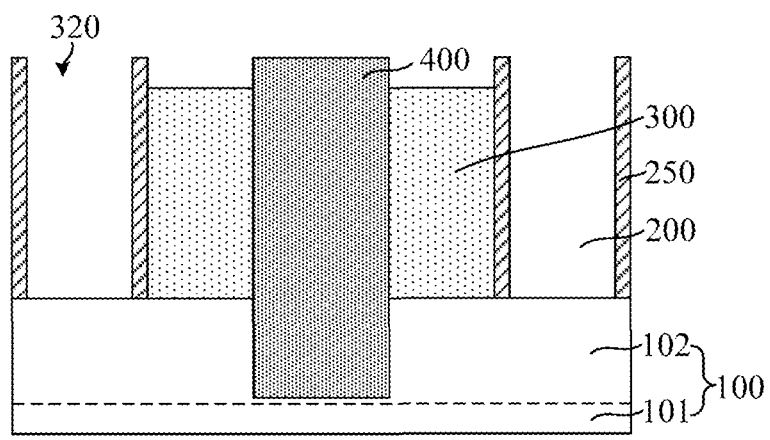

Referring to FIG. 11, after the isolation structure 400 is formed, the dummy gate structure 200 (as shown in FIG. 10) is removed and a gate opening 320 is formed in the interlayer dielectric layer 300.

The gate opening 320 is used for providing a spatial position for forming a metal gate structure subsequently.

In some implementations, after the dummy gate structure 200 is removed, the spacer 250 and the base 100 form the gate opening 320.

Figure 12:
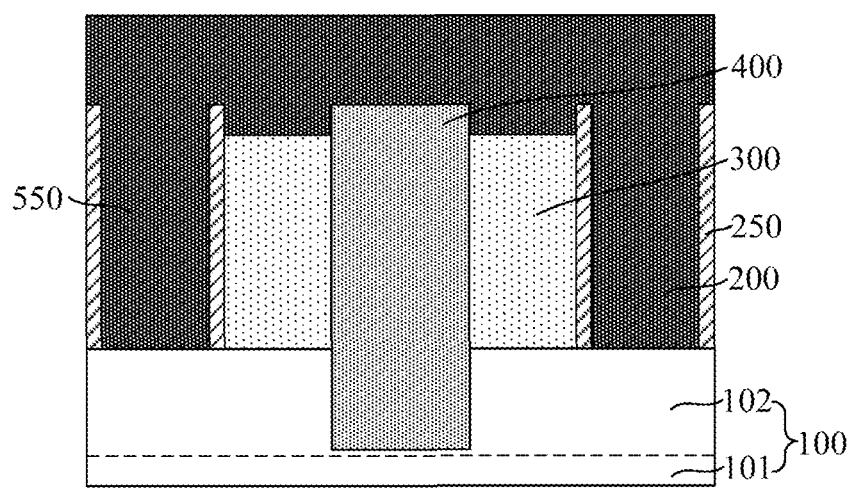

Referring to FIG. 12, a gate electrode material 550 is filled into the gate opening 320 (as shown in FIG. 11). The gate electrode material 550 further covers the top of the interlayer dielectric layer 300.

The gate electrode material 550 is used for providing a process foundation for forming a gate electrode layer subsequently, where the gate electrode layer is used as a part of the metal gate structure.

In some implementations, the gate electrode material 550 is W. In other embodiments, the gate electrode material may also be Al, Cu, Ag, Au, Pt, Ni or Ti.

In order to provide a sufficient process window for subsequent polishing treatment so as to improve the surface flatness of the gate electrode layer formed subsequently, the gate electrode material 550 is not only filled into the gate opening 320, but also covers the top of the interlayer dielectric layer 300 at least.

In some implementations, the gate electrode material 550 also covers the top of the isolation structure 400 and the top of the spacer 250.

Figure 13:
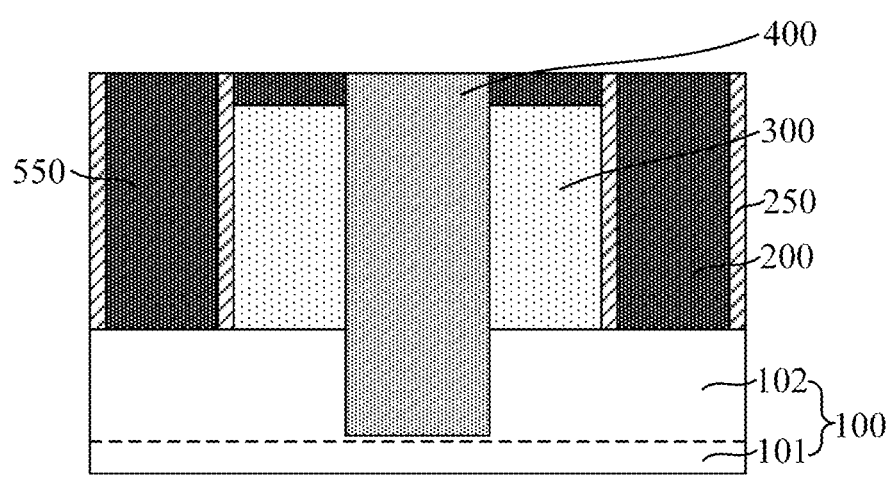
Figure 14:
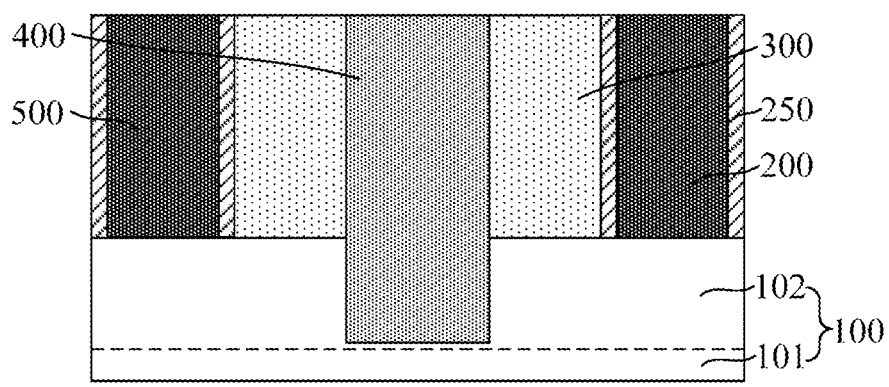

Referring to FIG. 13 and FIG. 14 in combination, at least one polishing treatment is performed to remove the gate electrode material 550 (as shown in FIG. 12) above the top of the interlayer dielectric layer 300 and the gate electrode material 550 in the gate opening 320 (as shown in FIG. 11) is retained as a gate electrode layer 500. The step of the polishing treatment includes: performing first polishing treatment on the gate electrode material 550 using a metal polishing liquid; and after the first polishing treatment, performing second polishing treatment on the isolation structure 400 using deionized water.

The first polishing treatment is used for removing the gate electrode material 550, so that the metal polishing liquid is generally an acid polishing liquid. Since there still has an acid solution residue on the surface of a wafer after each first polishing treatment, in the process of the second polishing process performed successively, the isolation structure 400 is in an acid environment, and a hydration reaction may occur to the isolation structure 400, so that the hardness and the strength, which are impacted by the second polishing treatment, of the isolation structure 400 are reduced, and it is easy to thin the isolation structure 400 through the second polishing treatment under the action of a mechanical force of the second polishing treatment.

To this end, after the isolation structure 400 is formed, even though the top of the isolation structure 400 protrudes from the top of the interlayer dielectric layer 300, in the step of removing the gate electrode material 550 above the top of the interlayer dielectric layer 300, the isolation structure 400 protruding from the interlayer dielectric layer 300 may also be removed by the polishing treatment, so that the gate electrode material 550 located on the top surface of the interlayer dielectric layer 300 may be exposed in the process environment of the first polishing treatment, so as to reduce the degree of difficulty in removing the gate electrode material 550 on the top surface of the interlayer dielectric layer 300, correspondingly, thereby preventing a residue of the gate electrode material 550 from forming on the top surface of the interlayer dielectric layer 300, and thus improving device performance.

The deionized water is also used as a polishing liquid for the second polishing treatment and functions in lubricating, which not only guarantees the normal working of the second polishing treatment, but also may reduce process costs and significantly reduce the producing of side effects.

Moreover, the deionized water is used as the polishing liquid for the second polishing treatment, so that the PH value of the polishing liquid for the second polishing treatment is relatively large, and polishing particles in the metal polishing liquid are removed under the action of the deionized water, thereby reducing the impact of the second polishing treatment on the gate electrode material 550 and the interlayer dielectric layer 300.

Correspondingly, even though the spacer 250 protrudes from the interlayer dielectric layer 300, the spacer 250 protruding from the interlayer dielectric layer 300 may also be removed in the polishing treatment, so that the effect of removing the gate electrode material 550 on the top surface of the interlayer dielectric layer 300 is further guaranteed, and correspondingly, it is also advantageous for improving the height uniformity of each of the gate electrode layer 500, so as to improve the uniformity of device performance.

The gate electrode material 550 is a metal material, and therefore, the metal polishing liquid is an acid polishing liquid, so as to guarantee a relatively high removal rate. There have relatively more oxidizing agents in the acid polishing liquid, the gate electrode material 550 is oxidized by the metal polishing liquid in the process of the first polishing treatment and is transformed into a metal oxide, and the metal oxide is softer than metal and easier to be removed mechanically.

According to a material selected by the gate electrode layer 500, a metal polishing liquid with a corresponding PH value is selected, so as to guarantee the effect of polishing the gate electrode material 550, and the metal polishing liquid is an acid polishing liquid.

The PH value of the metal polishing liquid should not be too large. If the PH value is too large, the acid environment where the isolation structure 400 is located may be caused to be weaker under the action of the deionized water in the process of the subsequent second polishing treatment, thereby reducing the effect of polishing the isolation structure 400 by the second polishing treatment. To this end, in this embodiment, the PH value of the metal polishing liquid is 2 to 6, for example, 4 or 5.

It should be noted that increasing the number of times of the polishing treatment may be advantageous for increasing the effect of removing the isolation structure 400 by the second polishing treatment. Correspondingly, after the polishing process is completed, the probability of having a residue of the gate electrode material 550 on the top surface of the interlayer dielectric layer 300 is reduced significantly. However, if the number of times is too much, the total time of the plurality of second polishing treatment may increase correspondingly, thereby reducing the efficiency of manufacturing. Moreover, in order to ensure that the thickness of the formed gate electrode layer 500 may meet process requirements, the increasing of the number of times may correspondingly cause the time for single first polishing treatment to be reduced, which may reduce the process stability of the first polishing treatment easily, thereby having adverse impact on the effect of polishing the gate electrode material 550. To this end, in this embodiment, in order to guarantee better process effects, the number of times of the polishing treatment is 3 to 12.

Figure 15:
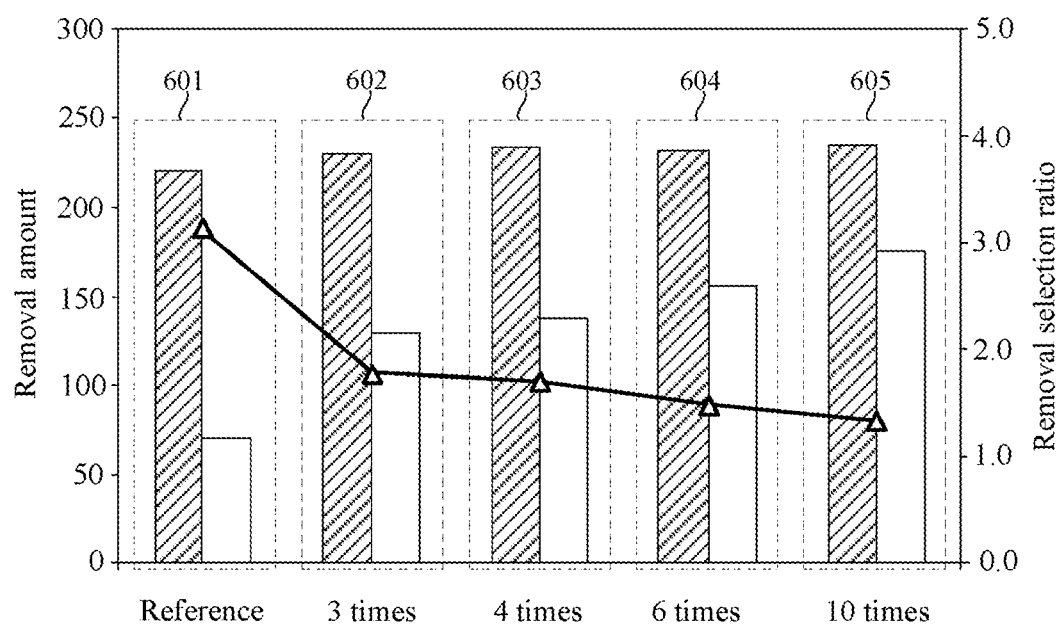
FIG. 15 illustrate bar graphs of a total removal amount and a line graph of a removal selection ratio of a gate electrode material and an isolation structure in different polishing conditions in embodiments shown in FIG. 7 to FIG. 14.

Referring to FIG. 15 in combination, FIG. 15 shows bar graphs of the total removal amount and a line graph of a removal selection ratio of a gate electrode material and an isolation structure in different polishing conditions.

A horizontal coordinate represents the number of times of the polishing treatment, a main vertical coordinate represents the total removal amount of the gate electrode material and the isolation structure, and a secondary vertical coordinate represents the removal selection ratio, where bar graphs filled with slashes represent the total removal amount of the gate electrode material, bar graphs filled with white represent the total removal amount of the isolation structure, and the removal selection ratio refers to a ratio of the total removal amount of the gate electrode material to the total removal amount of the isolation structure.

A dashed box 601 represents the event that second polishing treatment is not performed (that is, only a metal polishing liquid is used to perform one polishing treatment) and is used as a comparison reference, a dashed box 602 represents the event that three polishing treatment is performed circularly, a dashed box 603 represents the event that four polishing treatment is performed circularly, a dashed box 604 represents the event that six polishing treatment is performed circularly, and a dashed box 605 represents the event that ten polishing treatment is performed circularly.

It can be seen from the graphs that when the total time of performing polishing treatment using the metal polishing liquid is the same, performing first polishing treatment and the second polishing treatment successively is advantageous for reducing a difference value between the total removal amount of the gate electrode material and the isolation structure, and by increasing the number of times of circulate the polishing treatment, the difference value between the total removal amount of the gate electrode material and the isolation structure may also be reduced, so that the isolation structure protruding from the interlayer dielectric layer may be removed while the gate electrode material is removed by polishing.

It should also be noted that the process time of the second polishing treatment should not be too short or too long in each polishing treatment. If the process time is too short, the effect of removing the isolation structure 400 by the second polishing treatment may be reduced correspondingly. Correspondingly, after the polishing treatment is completed, the probability of still having a residue of the gate electrode material 550 on the top surface of the interlayer dielectric layer 300 is relatively high. With the increase of the process time of the second polishing treatment, the acid environment of the surface of the wafer weakens gradually, the impact of the second polishing treatment on the isolation structure 400 is reduced gradually, and even, when the process time of the second polishing treatment exceeds a certain value, the second polishing treatment may not have impact on the isolation structure 400 anymore. Therefore, too long process time may result in waste of cost and time. To this end, in some implementations, the process time of the second polishing treatment is 5 seconds to 15 seconds in each polishing treatment.

Specifically, in order to further increase the effect of removing the isolation structure 400 by the second polishing treatment, the process time of the second polishing treatment is 10 seconds to 15 seconds in each polishing treatment.

In the process of the second polishing treatment, a down force should not be too small or too large. If the down force is too small, the effect of removing the isolation structure 400 by the second polishing treatment may be reduced easily, and if the down force is too large, the gate electrode material 550 may be damaged easily. To this end, in some implementations, the down force of the second polishing treatment is 1.0 psi to 3.0 psi. Psi refers to pounds per square inch.

In the process of the second polishing treatment, a platen speed should not be too small or too large. If the platen speed is too small, in order to guarantee the effect of removing the isolation structure 400 by the second polishing treatment, the polishing efficiency may be reduced correspondingly, and if the platen speed is too large, the treatment effect uniformity of the second polishing treatment may become poor easily. To this end, in some implementations, the platen speed is 30 rpm to 100 rpm. Rpm refers to rounds per minute.

In the process of the second polishing treatment, a flow rate of the deionized water should not be too small or too large. If the flow rate is too small, the friction between the surface of the wafer and a polishing cushion may be increased easily, which, on the contrary, may increase the roughness of the isolation structure 400 and the gate electrode material 550, and if the flow rate is too large, an acid solution remaining on the surface of the wafer may be diluted easily and rapidly, and the isolation structure 400 may not have enough time to be in the required acid environment, thereby causing the effect of removing the isolation structure 400 by the second polishing treatment to become poor. To this end, in some implementations, the flow rate of the deionized water is 100 ml/min to 300 ml/min.

As shown in FIG. 13, since the gate electrode material 550 further covers the top of the isolation structure 400 and the top of the spacer 250, before performing the plurality of polishing treatment, the following is provided: performing pre-treatment on the gate electrode material 550 to remove partial thickness of the gate electrode material 550 and expose the top of the isolation structure 400.

By causing the remaining gate electrode material 550 to expose the top of the isolation structure 400, a process foundation is provided for performing polishing treatment subsequently, thereby reducing the difficulty of a subsequent process.

In some implementations, the pre-treatment is performed in a chemical mechanical polishing manner. By way of chemical mechanical polishing, after the pre-treatment is completed, subsequent first polishing treatment may be performed immediately with the same apparatus, which is not only advantageous for improving the manufacturing efficiency, but also advantageous for reducing the process risk.

In some other implementations, the pre-treatment may also be performed in an etch-back manner, or the pre-treatment may be performed in a manner combining etch-back with chemical mechanical polishing.

It should be noted that in other implementations, according to the distance between the top of the gate electrode material to the top of the isolation structure after the gate electrode material is formed, the pre-treatment may not be performed as well.

Referring to FIG. 14, embodiments and implementations of the present disclosure further provide a semiconductor structure formed by implementations of the foregoing forming method.

The semiconductor structure includes: a base 100; a gate electrode layer 500 located on the base 100; an interlayer dielectric layer 400 located on the base 100 exposed by the gate electrode layer 500, where the interlayer dielectric layer 400 further covers side walls of the gate electrode layer 500 and exposes the top of the gate electrode layer 500; and an isolation structure 400 located in the interlayer dielectric layer 300 between adjacent gate electrode layers 500 and extending into partial thickness of the base 100.

In the semiconductor structure, the probability that a metal residue (that is, a material residue of the gate electrode layer 500) is formed on the top of the interlayer dielectric layer 300 is relatively low, thereby improving the performance of a semiconductor device.

For the specific description about the semiconductor structure in this embodiment, reference can be made to the corresponding description in the foregoing embodiment, and details are not described again herein.

Although the disclosure is disclosed as above, it is not limited thereto. Various alterations and modifications may be made by a person skilled in the art without departing from the spirit and scope of the disclosure, and therefore, with regard to the scope of protection of the disclosure, the scope defined in the claims shall prevail.

What is claimed is:

1. A method for forming a semiconductor structure, comprising:
   providing a base, wherein a dummy gate structure is formed on the base, an interlayer dielectric layer is formed on the base exposed by the dummy gate structure, and the interlayer dielectric layer covers side walls of the dummy gate structure and exposes a top of the dummy gate structure;
   forming an isolation structure in the interlayer dielectric layer between adjacent dummy gate structures, wherein the isolation structure further extends into the base;
   after forming the isolation structure, removing the dummy gate structure and forming a gate opening in the interlayer dielectric layer;
   filling a gate electrode material into the gate opening, wherein the gate electrode material further covers a top of the interlayer dielectric layer; and
   performing at least one polishing treatment to remove the gate electrode material above the top of the interlayer dielectric layer and retaining the gate electrode material in the gate opening as a gate electrode layer, wherein the step of the polishing treatment comprises:
      performing a first polishing treatment on the gate electrode material using a metal polishing liquid; and
      after the first polishing treatment, performing a second polishing treatment on the isolation structure using deionized water.

2. The method for forming a semiconductor structure according to claim 1, further comprising:
   after filling a gate electrode material into the gate opening and before performing the polishing treatment, performing pre-treatment on the gate electrode material to remove partial thickness of the gate electrode material and expose the top of the isolation structure.

3. The method for forming a semiconductor structure according to claim 2, wherein the pre-treatment is performed in one or both of a chemical mechanical polishing manner and an etch-back manner.

4. The method for forming a semiconductor structure according to claim 1, wherein the number of times of the polishing treatment is 3 to 12.

5. The method for forming a semiconductor structure according to claim 1, wherein the process time of the second polishing treatment is 5 seconds to 15 seconds in each polishing treatment.

6. The method for forming a semiconductor structure according to claim 1, wherein the process time of the second polishing treatment is 10 seconds to 15 seconds in each polishing treatment.

7. The method for forming a semiconductor structure according to claim 1, wherein the PH value of the metal polishing liquid is 2 to 6 in the step of the first polishing treatment.

8. The method for forming a semiconductor structure according to claim 1, wherein parameters of the second polishing treatment comprise: a down force is 1.0 psi to 3.0 psi, a platen speed is 30 rpm to 100 rpm, and a flow rate of the deionized water is 100 ml/min to 300 ml/min.

9. The method for forming a semiconductor structure according to claim 1, wherein a material of the isolation structure is silicon nitride, polysilicon or metal nitride.

10. The method for forming a semiconductor structure according to claim 1, wherein the hardness of the isolation structure is higher than the hardness of the interlayer dielectric layer.

11. The method for forming a semiconductor structure according to claim 1, wherein a material of the interlayer dielectric layer is silicon oxide, and the material of the isolation structure is silicon nitride.

12. The method for forming a semiconductor structure according to claim 1, wherein the step of forming the isolation structure comprises:
    sequentially etching the interlayer dielectric layer between the adjacent dummy gate structures and partial thickness of the base to form a trench located in the interlayer dielectric layer and the base;
    filling an isolation material into the trench, wherein the isolation material further covers the top of the interlayer dielectric layer; and
    using a planarization process to remove the isolation material above the top of the interlayer dielectric layer and retaining the isolation material in the trench as the isolation structure.

13. The method for forming a semiconductor structure according to claim 12, wherein the planarization process is one or both of the chemical mechanical polishing manner and the etch-back manner.

14. The method for forming a semiconductor structure according to claim 1, wherein in the step of filling a gate electrode material into the gate opening, the gate electrode material is W, Al, Cu, Ag, Au, Pt, Ni or Ti.

15. A semiconductor structure formed by the forming method according claim 1.

\* \* \* \* \*